United States Patent
Xia

(10) Patent No.: US 7,365,623 B2
(45) Date of Patent: Apr. 29, 2008

(54) PERMANENT MAGNET, MAGNETIC DEVICE FOR USE IN MRI INCLUDING THE SAME, AND MANUFACTURING PROCESSES THEREOF

(75) Inventor: Pingchou Xia, Beijing (CN)

(73) Assignee: Beijing Taijie Yanyuan Medical Engineering Technical Co., Ltd., Beijing (CN)

( * ) Notice: Subject to any disclaimer, the term of this patent is extended or adjusted under 35 U.S.C. 154(b) by 0 days.

(21) Appl. No.: 11/411,808

(22) Filed: Apr. 27, 2006

(65) Prior Publication Data

US 2006/0279391 A1 Dec. 14, 2006

(30) Foreign Application Priority Data

| Jun. 10, 2005 | (CN) | ......................... 2005 1 0075185 |
| Jun. 23, 2005 | (CN) | ......................... 2005 1 0077392 |
| Mar. 9, 2006 | (CN) | ......................... 2006 1 0057291 |

(51) Int. Cl.
*H01F 7/02* (2006.01)

(52) U.S. Cl. ...................... 335/306; 335/296; 335/302; 335/304; 324/318; 324/320

(58) Field of Classification Search ........ 335/296–306; 324/318–320; 174/353
See application file for complete search history.

(56) References Cited

U.S. PATENT DOCUMENTS

| 5,034,715 | A | * | 7/1991 | Leupold et al. ............. 335/306 |
| 5,055,812 | A | * | 10/1991 | Abele et al. ................. 335/210 |
| 5,148,138 | A | * | 9/1992 | Miyata ........................ 335/302 |
| 6,828,890 | B2 | * | 12/2004 | Cope et al. .................. 335/296 |
| 6,850,140 | B1 | * | 2/2005 | Gleckner ..................... 335/306 |
| 6,861,935 | B1 | * | 3/2005 | Leupold ...................... 335/306 |
| 6,873,235 | B2 | * | 3/2005 | Fiske et al. .................. 335/306 |
| 6,876,284 | B2 | * | 4/2005 | Wright et al. ................ 335/229 |
| 7,148,777 | B2 | * | 12/2006 | Chell et al. .................. 335/306 |
| 2004/0036566 | A1 | * | 2/2004 | Komuro et al. ............. 335/306 |
| 2004/0135580 | A1 | * | 7/2004 | Abele .......................... 324/318 |
| 2005/0168311 | A1 | * | 8/2005 | Wright et al. ................ 335/306 |
| 2005/0242912 | A1 | * | 11/2005 | Chell et al. .................. 335/306 |
| 2006/0232368 | A1 | * | 10/2006 | Gorshkov .................... 335/306 |

OTHER PUBLICATIONS

Development of an Open 0.3 T NdFeB MRI Magnet; Xiaohua Jiang, Senior Member, IEEE,Guanghui Shen, Yongchuan Lai, and Jinfeng Tian ;IEEE Transactions on Applied Superconductivity, vol. 14, No. 2, Jun. 2004 1621.*

* cited by examiner

*Primary Examiner*—Elvin Enad
*Assistant Examiner*—Mohamad A Musleh
(74) *Attorney, Agent, or Firm*—Sughrue Mion, PLLC

(57) ABSTRACT

The present invention provides a permanent magnet, comprising a cylinder formed with a permanent magnetic material. The cylinder comprises along a radial direction, a magnetic core and a magnetic sheath that are coaxial. The magnetic core is assembled in the magnetic sheath. The magnetization direction of the magnetic core is axial direction, and the magnetization direction of the magnetic sheath changes step by step from a direction which is parallel to the magnetization direction of the magnetic core in one end to a direction which is orthogonal to the magnetization direction of the magnetic core in the other end, along the axial direction of the cylinder. Moreover, a magnetic device for use in MRI using the magnet and manufacturing methods for the permanent magnet and the magnetic device are also provided in the present invention. With the permanent magnet, magnetization strength in the working area generated by the magnetic device for use in MRI can amount to more than 0.5-0.6 T.

7 Claims, 13 Drawing Sheets

PRIOR ART

PRIOR ART

PERMANENT MAGNET, MAGNETIC DEVICE FOR USE IN MRI INCLUDING THE SAME, AND MANUFACTURING PROCESSES THEREOF

CROSS-REFERENCE TO RELATED APPLICATION

This application claims priority under 35 U.S.C. § 119 from Chinese Patent Application Nos. 200510075185.3, 200510077392.2 and 200610057291.3, the disclosure of each of which is incorporated herein by reference in its entirety.

Technical Field

The present invention relates to a permanent magnet, a magnetic device for use in MRI including the permanent magnet, and processes for manufacturing the permanent magnet and the magnetic device for use in MRI.

BACKGROUND

Magnetic Resonance Imaging (MRI) device has been a practical medical image diagnosing device since 1980s, and at present it is one of the most advanced image diagnosing devices used to discover and diagnose an early-state-cancer and other various diseases. The operating principle of the MRI is shown as follows: a human body is disposed in a particularly-arranged magnetic field; hydrogen atomic nuclei in the human body are excited by radio frequency magnetic field pulses, which makes the hydrogen atoms resonate and absorb energy; radio signals with certain frequencies are emitted from the hydrogen atoms after the radio frequency pulses are stopped, and the energy absorbed is released at the same time; and these signals are recorded by a receiver outside of the body and processed by a computer, to thereby obtain an image.

A main component in MRI is a magnetic device for generating space magnetic field. In order to obtain a clear and real image and accurately diagnose diseases of patients, the magnetic device in MRI is required to generate a homogeneously distributed and sufficiently strong magnetic field in the working area.

MRI can be classified into high field type (having magnetic strength above 3 T in the working area), medium field type (having 1±0.5 T of magnetic strength in the working area), and low field type (having magnetic strength less than 0.4 T in the working area) based on function and image quality. The higher the magnetic strength in the working area, the higher the signal to noise ratio. As a result, a clearer image, which contains more information, can be obtained. The high field type and the medium field type of MRI are fairly advantageous as compared with the low field type of MRI.

Currently, magnets often used for magnetic devices in MRI include superconducting magnets and permanent magnets. The superconducting magnet can generate a strong magnetic field. However, superconducting magnets have complicated structure and it is costly to manufacture. This is why the MRI using the superconducting magnet is very high-priced and operation and maintenance thereof are costly. MRI using the permanent magnet doesn't have these drawbacks, but working magnetic field must be enhanced so that its overall performance approaches that of the MRI using the superconducting magnet.

FIG. 1 is a schematic view of a magnetic device for use in MRI using a permanent magnet in prior art, and FIG. 2a through FIG. 2d show outlines of the permanent magnet used in FIG. 1.

As shown in FIG. 1, the existing magnetic device for use in MRI using a permanent magnet includes a magnetic yoke 1, an upper permanent magnet 2, a lower permanent magnet 3, an upper pole shoe 4, and a lower pole shoe 5. The upper permanent magnet 2 and the lower permanent magnet 3 are attached to the upper end and the lower end of the magnetic yoke 1, respectively, and face each other. The upper pole shoe 4 and the lower pole shoe 5 are disposed on the end surfaces of the upper permanent magnet 2 and the lower permanent magnet 3, respectively. There is an air gap between the upper pole shoe 4 and the lower pole shoe 5. In FIG. 1, an arrow in the upper permanent magnet 2 (or the lower permanent magnet 3) indicates magnetization direction in the magnet, and an arrow in the air gap 6 indicates magnetic field direction generated in the working area.

As shown in 2a through 2d, in the magnetic device for use in MRI in the prior art, the permanent magnet 2 consists of a permanent magnetic material with the same magnetization direction, and has an integrated cylindrical shape, such as cylinder, hollow cylinder, polygonal prism, and hollow polygonal prism. The magnetization direction of the permanent magnetic material is parallel to an axis of the cylinder, as shown by the arrow in the respective magnet.

The magnetic device for use in MRI shown in FIG. 1 has an open C-shape structure. In addition, there are some other structures of magnetic device for use in MRI in the prior art, such as four-column structure, two-column structure, and so on. These magnetic devices are described in detail in IEEE TRANSACTIONS OF APPLIED SUPERCONDUCTIVITY, VOL. 14, NO. 2, JUNE 2004, and Section 1.3.1 of Chapter 1 in MAGNETIC RESONANCE IMAGING, written by M. T. Vlaardingerbroek and J. A. den Boer, the 2nd edition.

The magnetic strength in the working area in the magnetic device for use in MRI in the prior art is only 0.4 T or less, thus, this MRI belongs to low field type. Medium field type of MRI and high field type of MRI generally require superconducting magnets. Therefore, the MRI using a permanent magnet is cheaper and has a good opening, and its structure is relatively simple. However, the magnetic strength generated by the permanent magnet is low. If a larger magnetic strength is required in the working area, an extremely large amount of permanent magnetic material should be used. As a result, the permanent magnet and the MRI including the permanent magnet are very heavy. For example, if 1±0.5 T of magnetic strength (standard strength for medium field type MRI) is required in the working area, 6-12 tons of permanent magnets need to be used. Therefore, there have not been any medium field types of MRIs using a permanent magnet in the prior art. The signal to noise ratio is low and high-speed pulse sequences cannot be performed because the magnetic strength in the conventional MRI using a permanent magnet is low. Accordingly, image definition is lower, and kinds and amount of information obtained are less, as compared to superconducting MRI.

Additionally, permanent magnets and magnetic devices for use in MRI are disclosed in many patent documents. For example, CN1116311A discloses a magnetic field generating apparatus for use in MRI; CN240413Y discloses a magnet apparatus used in magnetic resonance imaging system; CN2430698Y discloses a C shape magnetic resonance imaging permanent magnet without blocking magnetic pole; CN1371000A discloses a completely opened magnetic resonant imaging instrument; CN1400473A discloses a permanent magnet device for magnetic resonance imaging system; CN2542225Y discloses a two-column open C-type permanent-magnet magnetic resonance magnet; CN1491613A discloses a method for assembling magnetic parts for producing magnetic field to form magnetic resonance imaging; and CN1588582A discloses a main magnet body of thin sheet type magnetic field in a fully open magnetic resonance imaging instrument.

However, like the MRI shown in FIG. 1, the permanent magnets or MRI devices disclosed in the above-mentioned documents also have the following drawbacks: because the magnetization strength in the working area is very low (it is only 0.4 T or less), it cannot be used in the medium field type of MRI or the high field type of MRI. Therefore, it is unknown in the art how magnetization strength of a permanent magnet can be enhanced in order to achieve the permanent magnet for use in MRI with higher magnetization strength in the working area, provided that opening degree, consumed amount of the magnetic material, and main sizes and total weight of the magnet all remain unchanged.

SUMMARY OF THE INVENTION

The first object of the present invention is to provide a permanent magnet that can generate a strong magnetic field in the working area.

The second object of the present invention is to provide a magnetic device for use in MRI including a permanent magnet that can generate a strong magnetic field in the working area.

The third object of the present invention is to provide a manufacturing method for a permanent magnet.

The fourth object of the present invention is to provide a forming method for a magnetic device for use in MRI using the permanent magnet.

According to the first aspect of the present invention, there is provided a permanent magnet, comprising a cylinder formed with a permanent magnetic material, wherein the cylinder comprises a magnetic core and a magnetic sheath along the radial direction, the magnetic core and the magnetic sheath being coaxial, the magnetic core being assembled in the magnetic sheath, and the magnetization direction of the magnetic core being axial direction, the magnetization direction of the magnetic sheath changing step by step from a direction which is parallel to the magnetization direction of the magnetic core in one end to a direction which is orthogonal to the magnetization direction of the magnetic core in the other end, along the axial direction of the cylinder.

According to the second aspect of the present invention, there is provided a magnetic device for use in MRI using a permanent magnet, comprising a magnetic yoke, an upper permanent magnet, a lower permanent magnet, an upper pole shoe, and a lower pole shoe, wherein, the upper permanent magnet includes a cylinder formed with a permanent magnetic material, the cylinder comprising along a radial direction a magnetic core and a magnetic sheath, the magnetic core and the magnetic sheath being coaxial, the magnetic core being assembled in the magnetic sheath, and the magnetization direction of the magnetic sheath changing step by step from a direction which is parallel to the magnetization direction of the magnetic core in one end to a direction which is orthogonal to the magnetization direction of the magnetic core in the other end, along the axial direction of the cylinder, the magnetization direction in the upper end of the magnetic sheath being axial direction, the magnetization direction in the lower end being inward radially; the lower permanent magnet includes a cylinder formed with a permanent magnetic material, the cylinder comprises along a radial direction, a magnetic core and a magnetic sheath, the magnetic core and the magnetic sheath being coaxial, the magnetic core being assembled in the magnetic sheath, and the magnetization direction of the magnetic sheath changing step by step from a direction which is parallel to the magnetization direction of the magnetic core in one end to a direction which is orthogonal to the magnetization direction of the magnetic core in the other end, along the axial direction of the cylinder, the magnetization direction in the upper end of the magnetic sheath being outward radially, the magnetization direction in the lower end being axial direction.

According to the third aspect of the present invention, there is provided a manufacturing method for a permanent magnet, comprising the steps of: forming a magnetic core with axial magnetization direction; forming a magnetic sheath; and assembling the magnetic core into the magnetic sheath tightly, thereby causing the magnetization direction of the magnetic sheath to change step by step from a direction which is parallel to the magnetization direction of the magnetic core in one end to a direction which is orthogonal to the magnetization direction of the magnetic core in the other end, along the axial direction of the cylinder.

According to the fourth aspect of the present invention, there is provided a forming method for a magnetic device for use in MRI using a permanent magnet, the magnetic device comprising a magnetic yoke, an upper permanent magnet, a lower permanent magnet, an upper pole shoe, and a lower pole shoe, wherein the forming method for the upper permanent magnet includes the steps of: forming a magnetic core with magnetization direction being downward axially; forming a magnetic sheath; and assembling the magnetic core into the magnetic sheath tightly, thereby causing the magnetization direction of the magnetic sheath to change step by step from a direction which is parallel to the magnetization direction of the magnetic core in one end to a direction which is orthogonal to the magnetization direction of the magnetic core in the other end along the axial direction of the cylinder, the magnetization direction in the upper end of the magnetic sheath being downward axially, the magnetization direction in the lower end being inward radially; and the forming method for the lower permanent magnet includes the steps of: forming a magnetic core with magnetization direction being downward axially; forming a magnetic sheath; and assembling the magnetic core into the magnetic sheath tightly, thereby causing the magnetization direction of the magnetic sheath to change step by step from a direction which is parallel to the magnetization direction of the magnetic core in one end to a direction which is orthogonal to the magnetization direction of the magnetic core in the other end along the axial direction of the cylinder, the magnetization direction in the upper end of the magnetic sheath being outward radially, the magnetization direction in the lower end being downward axially.

The upper pole shoe comprises a pole core and a pole sheath along a radial direction, the pole core and the pole sheath being coaxial, the pole core being assembled in the pole sheath tightly, the magnetization direction of the pole sheath being inward radially; and the lower pole shoe comprises a pole core and a pole sheath along a radial direction, the pole core and the pole sheath being coaxial, the pole core being assembled in the pole sheath, the magnetization direction of the pole sheath being outward radially.

Therefore, with the above technical solutions of the present invention, the permanent magnet according to the present invention can achieve a higher magnetic field strength even when it has substantially the same size and shape, as compared to a permanent magnet in the prior art. The potential of the permanent magnet is mostly utilized in the present invention. The magnetization strength in the working area generated by the permanent magnet of the present invention can amount to more than 0.5-0.6 T, and thus, the permanent magnetic can be used in the medium field type MRI.

LIST OF REFERENCE NUMBERS

Figure 1:
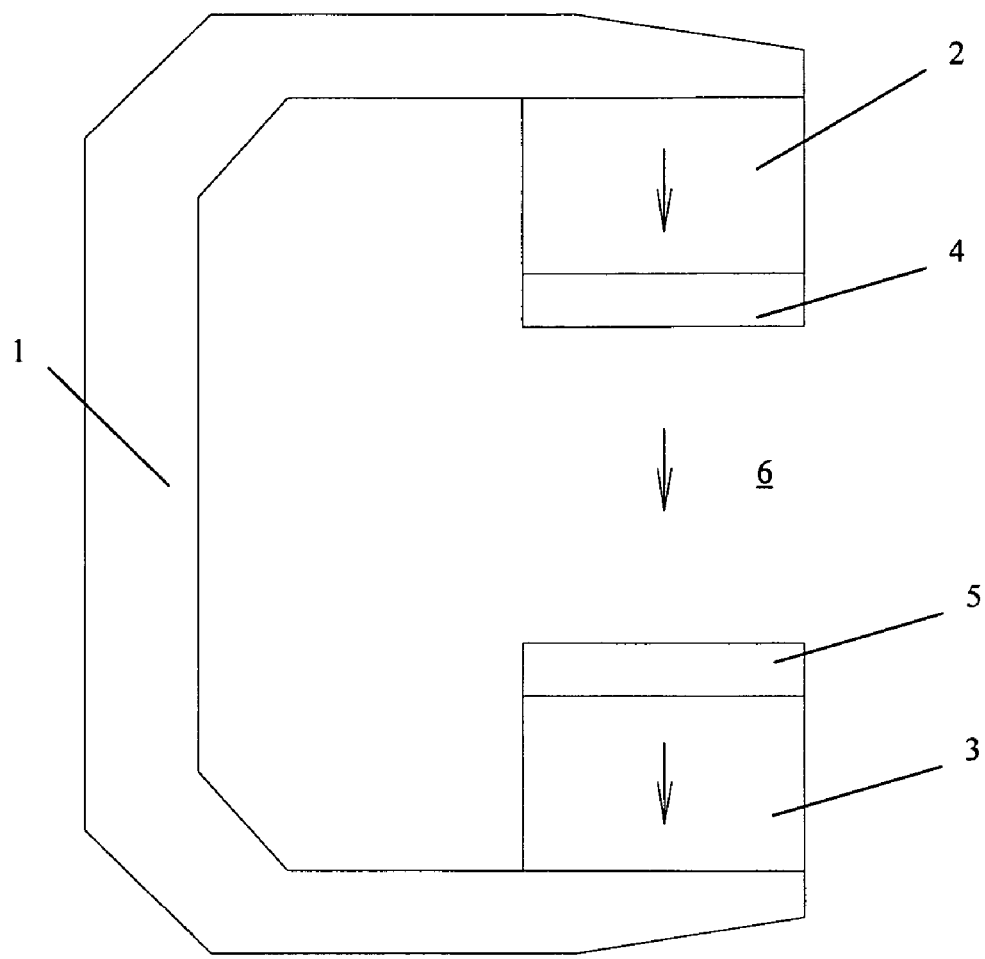
FIG. 1 is a schematic view of a magnetic device for use in MRI using a permanent magnet in prior art.
Figure 2A:
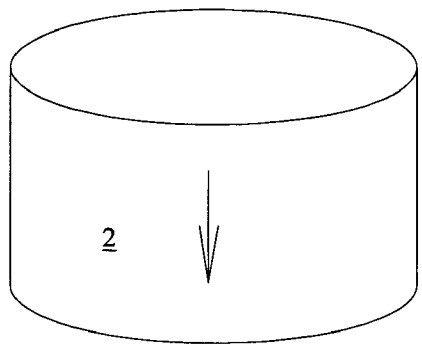
FIGS. 2a through 2d show outlines of the permanent magnet used in FIG. 1.
Figure 2B:
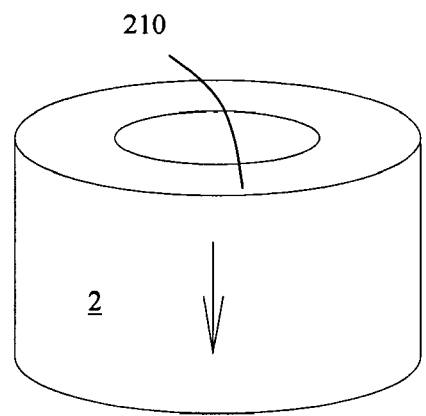
Figure 2C:
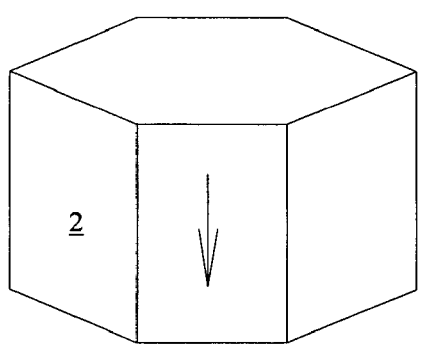
Figure 2D:
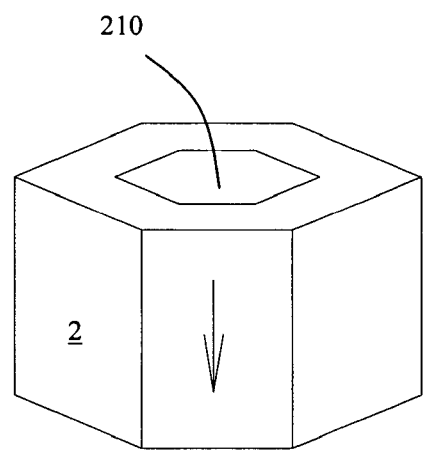

1 magnetic yoke
2 upper permanent magnet
3 lower permanent magnet
4 upper pole shoe
5 lower pole shoe
6 air gap
21,31 magnetic core
22,32 magnetic sheath
210,310 through hole
221,321 magnetic layer
222,322 magnetic lobe
41,51 pole core
42,52 pole sheath
420,520 magnetic lobe

DETAILED DESCRIPTION OF CERTAIN INVENTIVE EMBODIMENTS

The principle of the present invention and its illustrative embodiments will now be described in detail with reference to the drawings, however, the present invention is not restricted to these examples.

According to the first aspect of the present invention, as shown in the FIGS. 3a through 3l, the present invention provides a permanent magnet, comprising a cylinder formed with a permanent magnetic material, wherein the cylinder comprises along a radial direction, a magnetic core 21 and a magnetic sheath 22, which are coaxial. The magnetic core 21 is assembled in the magnetic sheath 22. The magnetization direction of the magnetic core 21 is axial direction. The magnetization direction of the magnetic sheath 22 changes step by step from a direction which is parallel to the magnetization direction of the magnetic core 21 in one end to a direction which is orthogonal to the magnetization direction of the magnetic core 21 in the other end, along the axial direction of the cylinder.

FIGS. 3e through 3l show a plurality of arrangement forms of the magnetization directions of the magnetic core 21 and the magnetic sheath 22 in the permanent magnet, respectively, where dotted arrows indicate the magnetization direction of the magnetic core 21, and solid arrows indicate the magnetization direction of the magnetic sheath 22.

In FIGS. 3e through 3h, the magnetization direction of the magnetic core 21 is the same as that in an end of the magnetic sheath 22. As shown in the figures, the magnetization direction of the magnetic core 21 is downward axially, and the magnetization direction in an end of the magnetic sheath 22 is also downward axially, and the magnetization direction in the other end of the magnetic sheath 22 is in radial direction. The magnetization direction of the magnetic sheath 22 changes step by step from a direction downward axially in an end to a radial direction in the other end.

In FIGS. 3i through 3l, the magnetization direction of the magnetic core 21 is opposite to that in an end of the magnetic sheath 22. As shown in the FIGS., the magnetization direction of the magnetic core 21 is downward axially, but the magnetization direction in an end of the magnetic sheath 22 is upward axially, and the magnetization direction in the other end of the magnetic sheath 22 is in radial direction. The magnetization direction of the magnetic sheath 22 changes step by step from a direction upward axially in an end to a radial direction in the other end.

As shown in FIGS. 3e through 3l, there are many other arrangement forms between the magnetization direction of the magnetic core 21 and the magnetization direction of the magnetic sheath 22.

Figure 3A:
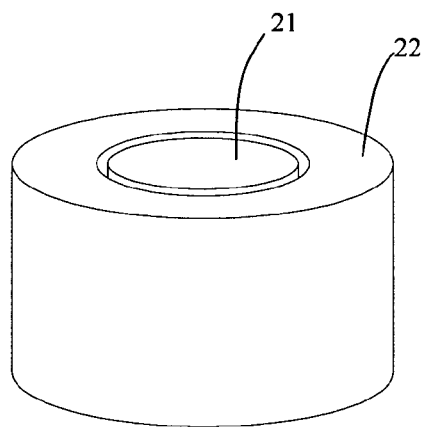
FIGS. 3a through 3d show outlines of the permanent magnet according to the present invention.
Figure 3B:
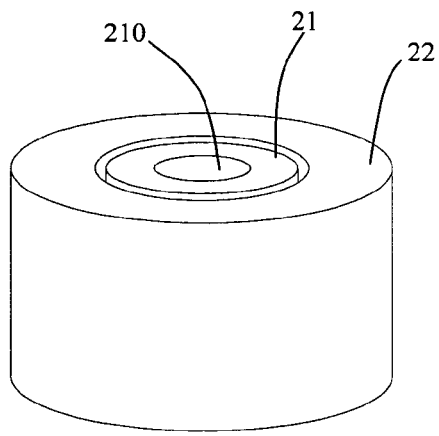
Figure 3C:
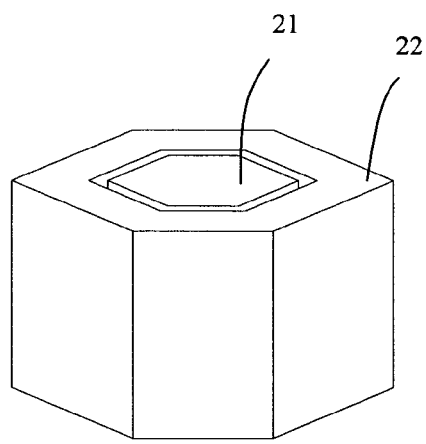
Figure 3D:
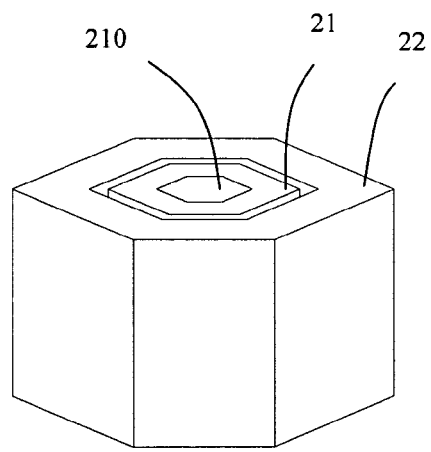
Figure 3E:
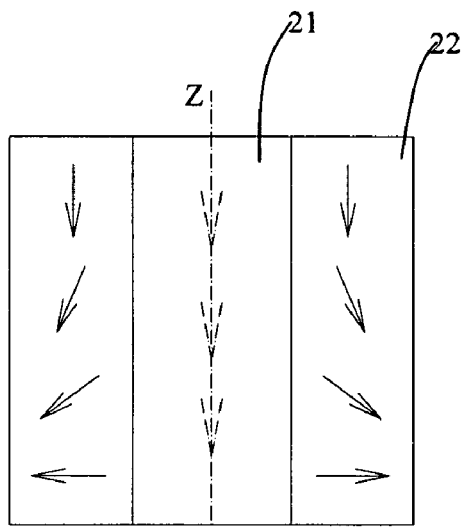
FIGS. 3e through 3l show schematic sectional views of the permanent magnet according to the present invention, wherein the magnetization direction is shown.

As shown in FIG. 3e, the magnetization direction of the magnetic core 21 is downward axially, where Z indicates the axis of the magnetic core. The magnetization direction in the upper end of the magnetic sheath 22 is downward axially, and the magnetization direction in the lower end of the magnetic sheath 22 is outward radially. The magnetization direction of the magnetic sheath 22 changes step by step from the upper end to the lower end. This is to say, the magnetization direction in the upper end of the magnetic sheath is downward axially, and then the magnetization direction at a little lower location from the upper end of the magnetic sheath is slightly outward, i.e. the lower the location is, the more outward the magnetization direction is, and finally, when the location is in the lower end, the magnetization direction becomes completely outward radially. The magnetization direction of the magnetic sheath 22 changes step by step from downward axially in the upper end to outward radially in the lower end, i.e. changes gradually.

Figure 3F:
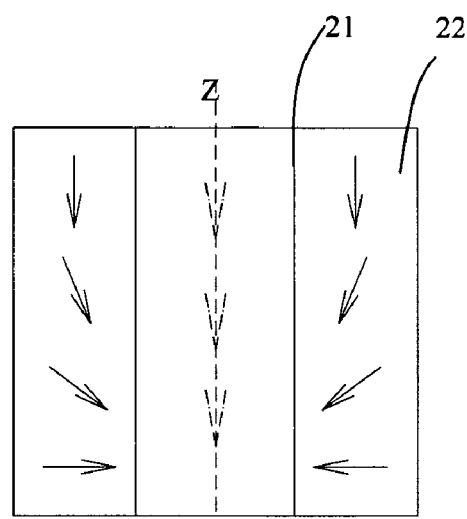

As shown in FIG. 3f, the permanent magnet is substantially the same as that in FIG. 3e, except that the magnetization direction in the lower end of the magnetic sheath 22 is inward radially, this is to say, the magnetization direction of the magnetic sheath 22 changes gradually from downward axially in the upper end to inward radially in the lower end.

Figure 3G:
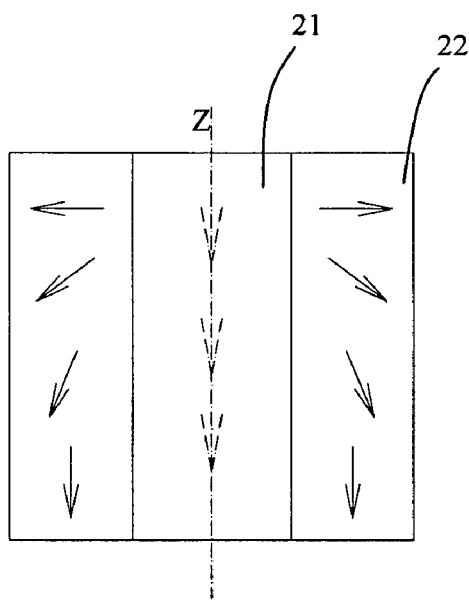

As shown in FIG. 3g, the permanent magnet is substantially the same as that shown in FIG. 3e, except that the magnetization direction in the upper end of the magnetic sheath 22 is outward radially and the magnetization direction in the lower end is downward axially, this is to say, the magnetization direction of the magnetic sheath 22 changes gradually from outward radially in the upper end to downward axially in the lower end.

Figure 3H:
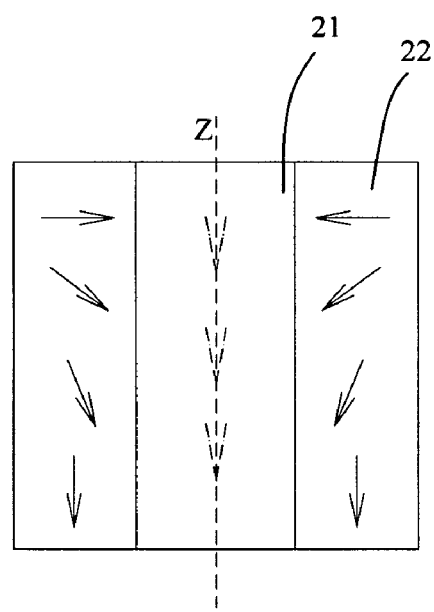
Figure 3I:
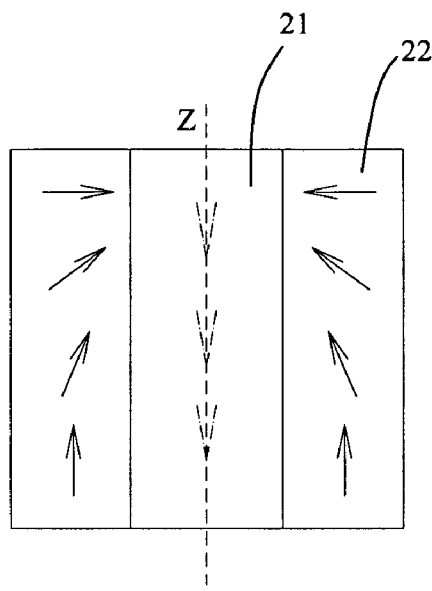
Figure 3J:
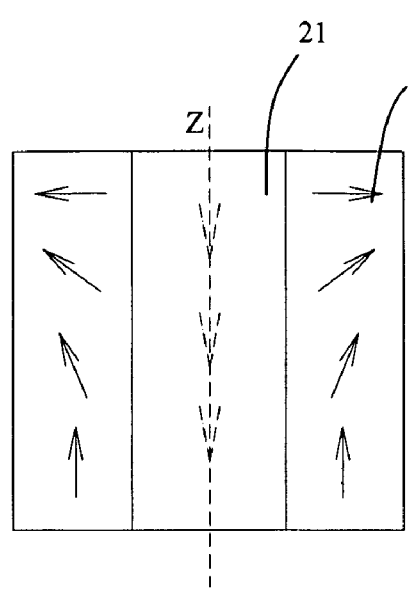
Figure 3K:
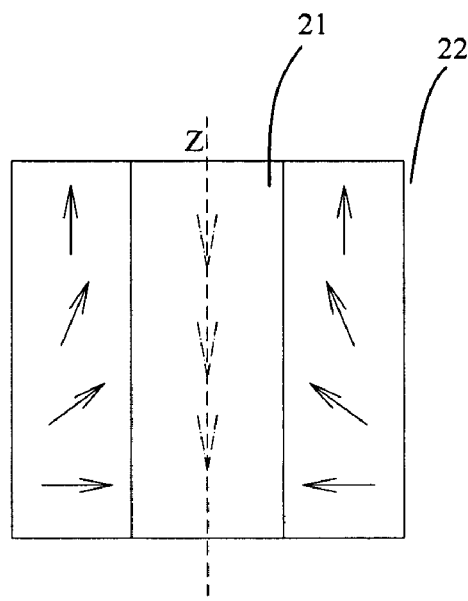
Figure 3L:
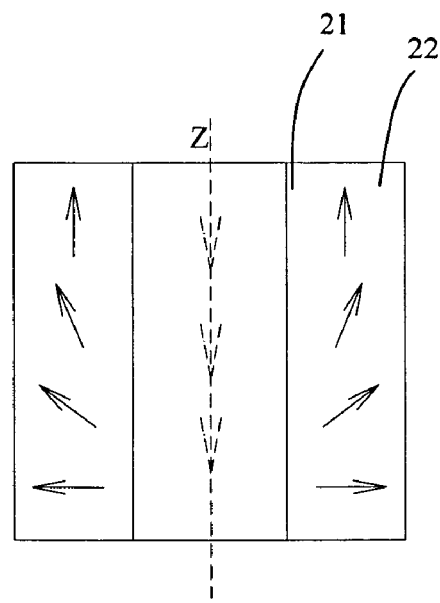

As shown in FIG. 3h, the permanent magnet is substantially the same as that shown in FIG. 3e, except that the magnetization direction in the upper end of the magnetic sheath 22 is inward radially, this is to say, the magnetization direction of the magnetic sheath 22 changes gradually from inward radially in the upper end to downward axially in the lower end.

The permanent magnets shown in FIGS. 3i through 3l are substantially the same as ones shown in FIGS. 3e through 3h, except that the axial magnetization direction in one end of the magnetic sheath 22 is opposite to the axial magnetization direction of the magnetic core 21. This is to say, if the magnetization direction of the magnetic core 21 is downward axially, the axial magnetization direction in one end of the magnetic sheath 22 is upward axially.

There is no specific limit for shapes of the magnetic core 21 and the magnetic sheath 22 according to the present invention. The magnetic core 21 may be regular or irregular in shape, such as cylinder, hollow cylinder, polygonal prism, equilateral polygonal prism, hollow polygonal prism, equilateral hollow polygonal prism, elliptical cylinder, and other cylinders with an irregular cross section. The magnetic sheath 22 may be regular or irregular in shape, such as cylindrical sheath, polygonal sheath, equilateral polygonal sheath, elliptical cylindrical sheath, and other cylindrical sheathes with an irregular cross section. FIGS. 3a through 3d show several illustrative shapes of the permanent magnets according to the present invention.

As shown in FIG. 3a, the magnetic core 21 is formed to be a cylinder, and the magnetic sheath 22 is formed to be a barrel. The magnetic core 21 is assembled in the magnetic sheath 22. For clarity, there shows a gap between the magnetic core 21 and the magnetic sheath 22 in the drawing, however, the magnetic core 21 is assembled tightly in the magnetic sheath 22 in actual products.

As shown in FIG. 3b, the only difference between the permanent magnet and the one in the FIG. 3a is in that the magnetic core 21 is formed to be a hollow cylinder, this is to say, there is formed a through hole 210 in the center of the magnetic core 21.

As shown in FIG. 3c, the magnetic core 21 is formed to be a polygonal prism, and the magnetic sheath 22 is also formed to be a polygonal prismatic sheath. The magnetic core 21 is closely assembled in the magnetic sheath 22.

As shown in FIG. 3d, the only difference between the permanent magnet and the one in FIG. 3c is that there is formed in the center of the magnetic core 21, a through hole 210 which is perforated axially.

As shown in FIGS. 3c and 3d, said polygonal prism and/or polygonal prismatic sheath may be an equilateral polygonal prism and/or an equilateral polygonal prismatic sheath.

Moreover, an outer prismatic surface of the magnetic core 21 and an outer prismatic surface of the magnetic sheath 22 may be same in shape (as shown in FIG. 3a to FIG. 3d), or different in shape (not shown in drawings). For example, the magnetic core 21 is a cylinder, and an inner prismatic surface of the magnetic sheath 22 is cylindrical, but the outer prismatic surface may be polygonal prism or ellipse, and so on. Those skilled in the art can combine the magnetic core and the magnetic sheath with any prismatic shapes based on their needs.

According to the present invention, the magnetic core 21 and the magnetic sheath 22 may be made from the same or different permanent magnetic material. The permanent magnetic material can be selected from any known permanent magnetic material, such as sintered neodymium-iron-boron, bonding rare earth permanent magnetic material, rare earth-cobalt material, permanent magnetic ferrite, and the like.

In order to optimize the performance of the permanent magnet, it is preferable that the sizes of the magnetic core and the magnetic sheath meet the following requirements: for example, the ratio of the diameter to the height of the magnetic core may be 1 to 5, preferably 3.4 to 4; the thickness of the magnetic sheath may be 10% to 80%, preferably 50% to 55%; and the ratio of the thickness to the height of the magnetic sheath may be 0.05 to 2, preferably 1.5 to 1.7.

The magnetic sheath 22 may include a plurality of magnetic layers 221 along axial direction according to a preferred embodiment of the present invention, as shown in figures 4a through 4d. With this structure, it is very easy to realize gradual change from axial magnetization direction in the upper end of the magnetic sheath 22 to radial magnetization direction in the lower end of the magnetic sheath 22, i.e. stepwise change of magnetization direction of the magnetic sheath 22. Additionally, the step size of the stepwise change can be controlled by selecting magnetic layers each having a different thickness (including some layers with zero thickness) and using different magnetic materials.

As shown in the drawings, every magnetic layer 221 is formed to be an annular sheath, this is to say, the magnetic layer 221 consists of a series of assumed plane slices which are vertical to the axis of the magnetic core 21. Different magnetic layers 221 in the magnetic sheath 22 may have the same size, or may have different sizes, this is to say, heights of different magnetic layers 221 may be equal or unequal. The thickness of some magnetic layers may be zero under certain circumstances.

There is no specific limit for the size, the number and the material of the magnetic layer 221 in the magnetic sheath 22 according to the present invention. For example, the height of each magnetic layer may be 0% to 30%, preferably 10% to 20%, of the height of the magnetic sheath; the number of the magnetic layers may be 1 to 10, preferably 5 to 6; material for each magnetic layer may be the same or different from each other, and may be selected from sintered neodymium-iron-boron, bonding rare earth permanent magnet, rare earth-cobalt material, permanent magnetic ferrite, and the like.

Figure 4A:
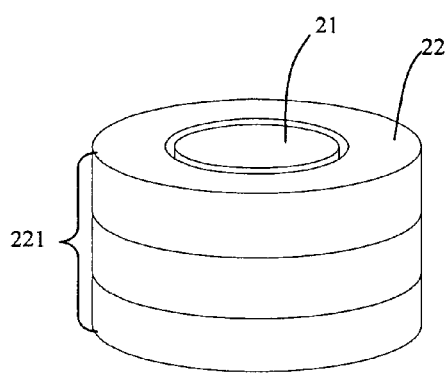
FIGS. 4a through 4d show outlines of the permanent magnet according to the first embodiment of the present invention.
Figure 4B:
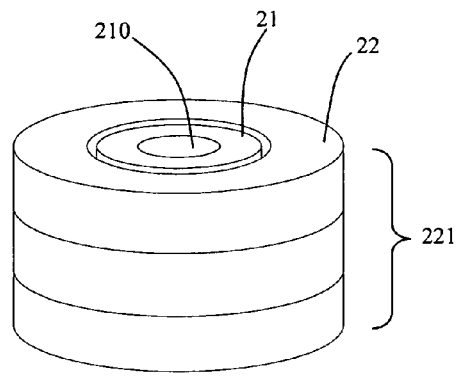
Figure 4C:
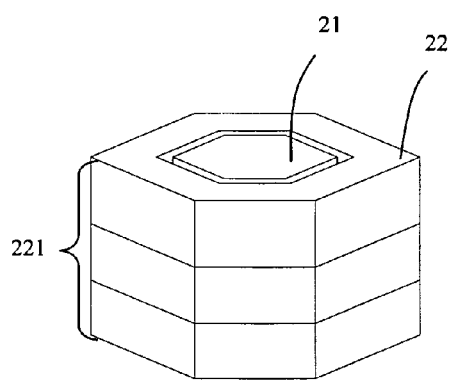
Figure 4D:
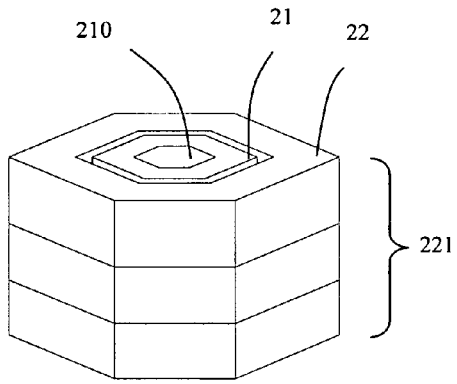
Figure 4E:
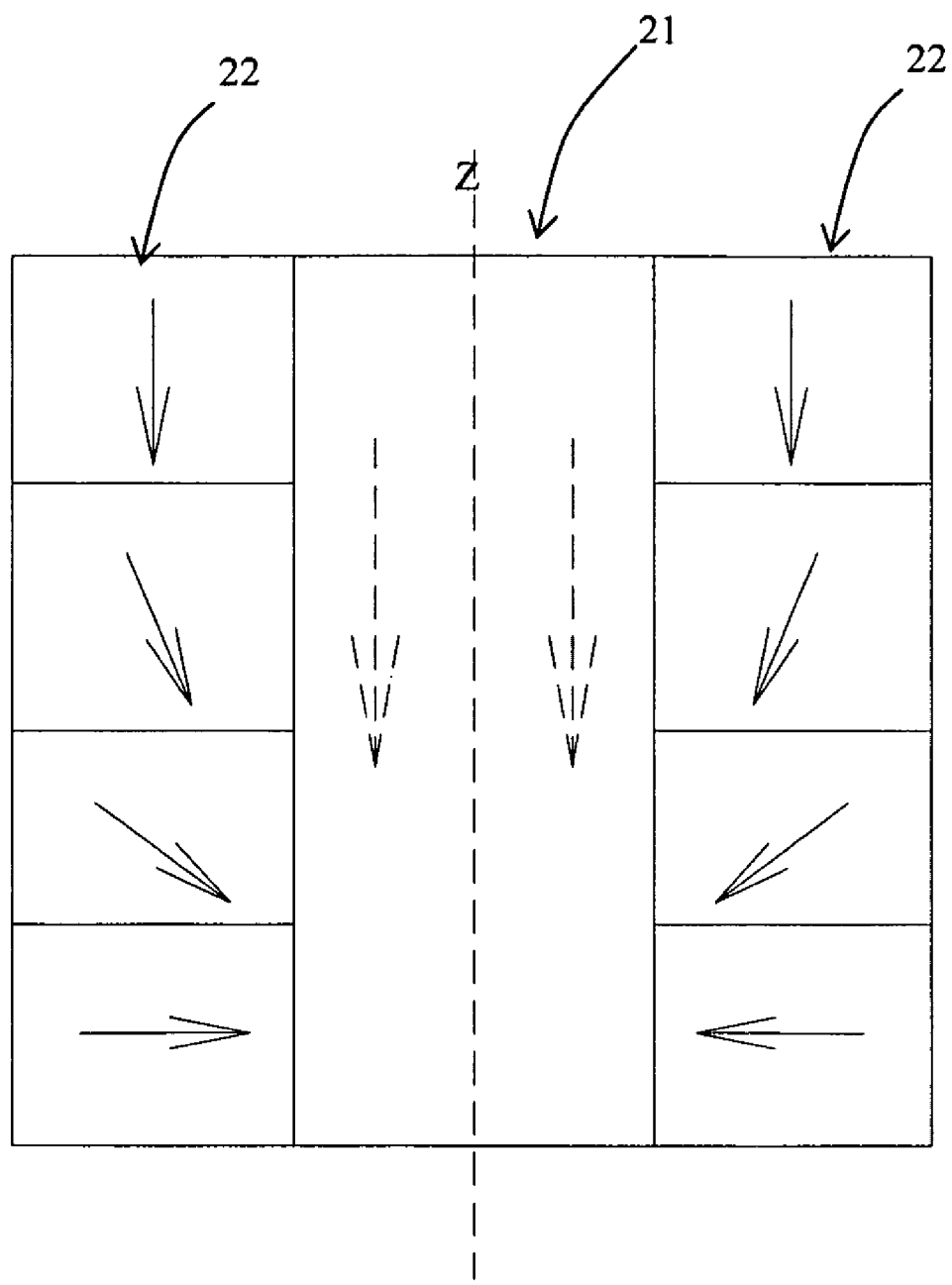
FIG. 4e shows a schematic section view of the permanent magnet according to the first embodiment of the present invention, wherein the magnetization direction is shown.

FIG. 4e is a schematic sectional view of the permanent magnet according to the present invention, where dotted arrows indicate the magnetization direction of the magnetic core 21, and solid arrows indicate the magnetization direction of the respective magnetic layer 221.

As shown in FIG. 4e, each magnetic layer 221 has its respective magnetization direction, and magnetization directions change step by step from the uppermost magnetic layer to the lowermost magnetic layer. Therefore, it is convenient to realize stepwise change from the magnetization direction in the upper end to the magnetization direction in the lower end of the magnetic sheath 22 by sequentially stacking different magnetic layers 221 with different magnetization directions.

Each magnetic layer 221 of magnetic sheath 22 may include a plurality of magnetic lobes in its circumference according to another preferred embodiment of the present invention, as shown in FIGS. 5a through 5d. This constitution makes it more convenient to realize gradual change from axial magnetization direction in the upper end of the magnetic sheath 22 to radial magnetization direction in the lower end of the magnetic sheath 22, i.e., realize stepwise change of the magnetization directions.

As shown in the drawing, each magnetic lobe 222 is separated by a series of plane slices passing through the axial of the magnetic core 21. The magnetic lobes 222 in each magnetic layer 221 may have the same size, or may have different sizes, and all of magnetic lobes 222 in all magnetic layers 221 may have the same size or different sizes.

There is no specific limit for the size, the number and the material of the magnetic lobes 222 according to the present invention. For example, the number of magnetic lobes of each magnetic layer may be 16 to 64, preferably 16 to 32; the magnetic lobes of each magnetic layer may be arranged axially in an aligned manner or in an unaligned manner; material for each magnetic lobe may be the same or different from each other.

Figure 5A:
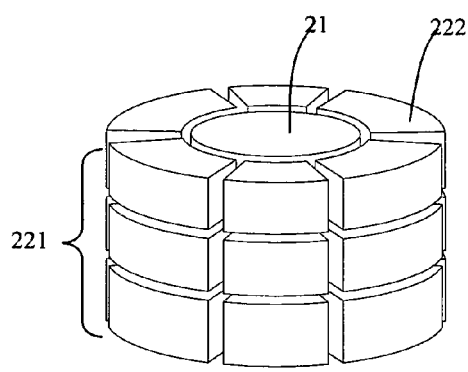
FIGS. 5a through 5d show outlines of the permanent magnet according to the second embodiment of the present invention.
Figure 5B:
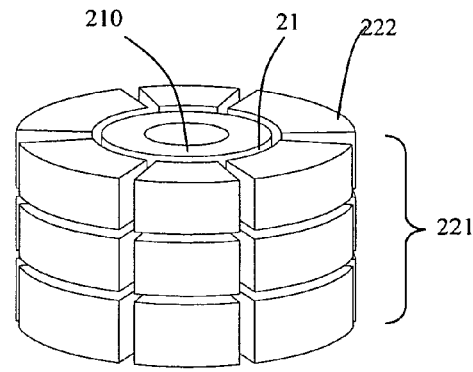
Figure 5C:
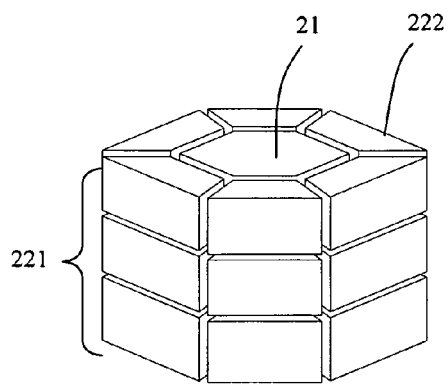
Figure 5D:
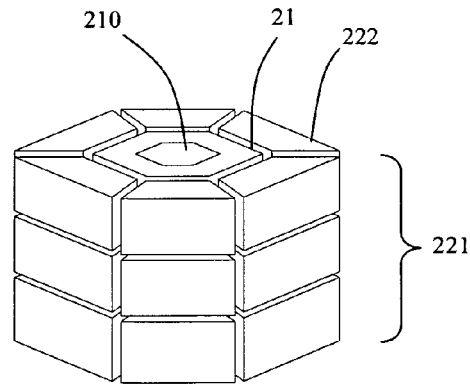
Figure 5E:
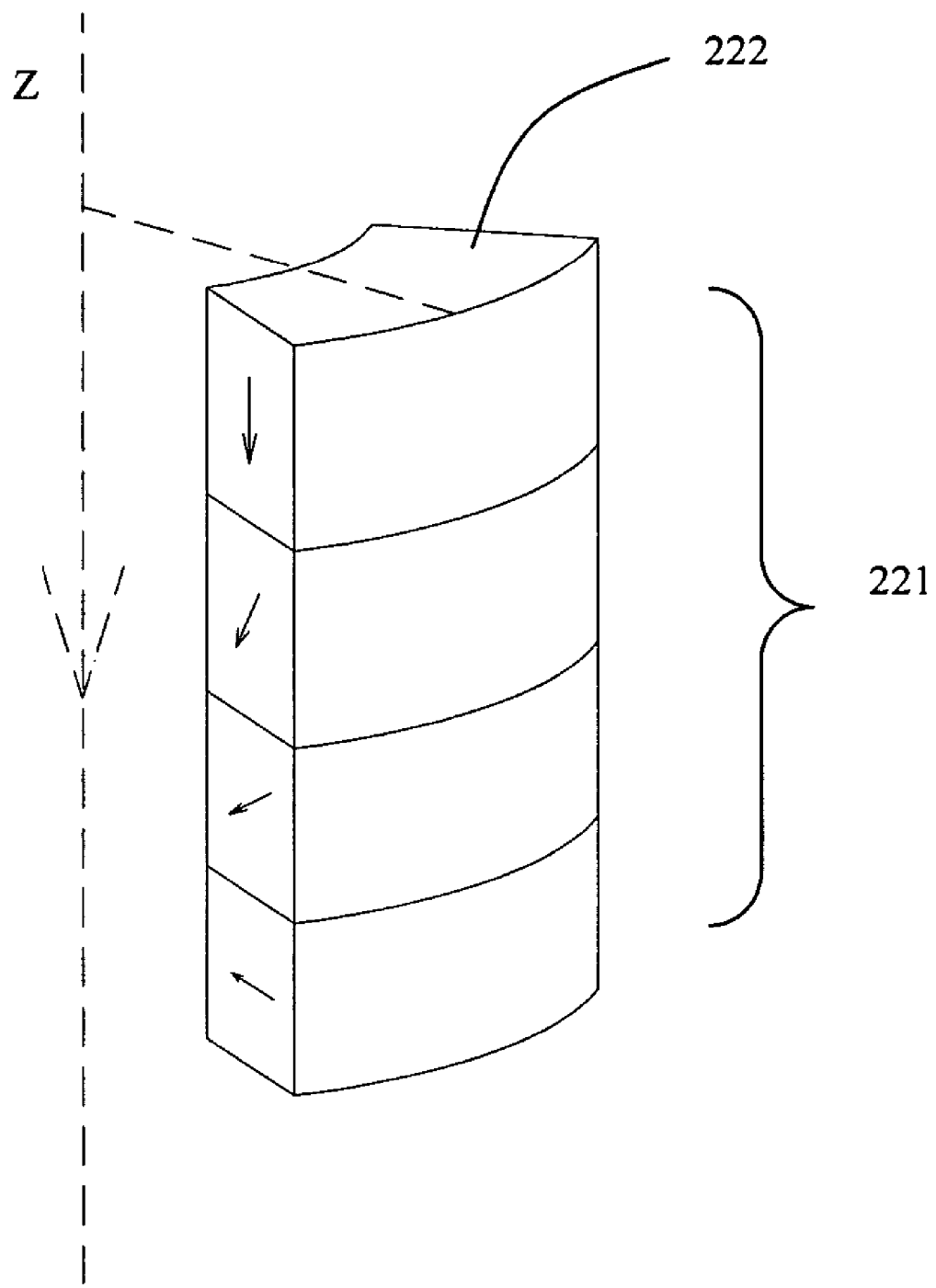
FIG. 5e shows a schematic view of a series of magnetic lobes in the permanent magnet according to the second embodiment of the present invention, wherein the magnetization direction is shown.

FIG. 5e shows a schematic view of a row of longitudinal magnetic lobes in the magnetic sheath 22, wherein Z indicates the axis of the permanent magnet, dotted arrows indicate the magnetization direction of the magnetic core, and solid arrows indicate the magnetization direction of the magnetic lobe 222. Each magnetic lobe 222 itself has a unique magnetization direction. It is very convenient to realize stepwise change of the magnetization directions of a row of magnetic lobes relative to the magnetization direction of the magnetic core by sequentially stacking respective magnetic lobes together, thus it is very convenient to realize stepwise change of the magnetization directions of the magnetic sheath 22 relative to the magnetization direction of the magnetic core 21.

Figure 6:
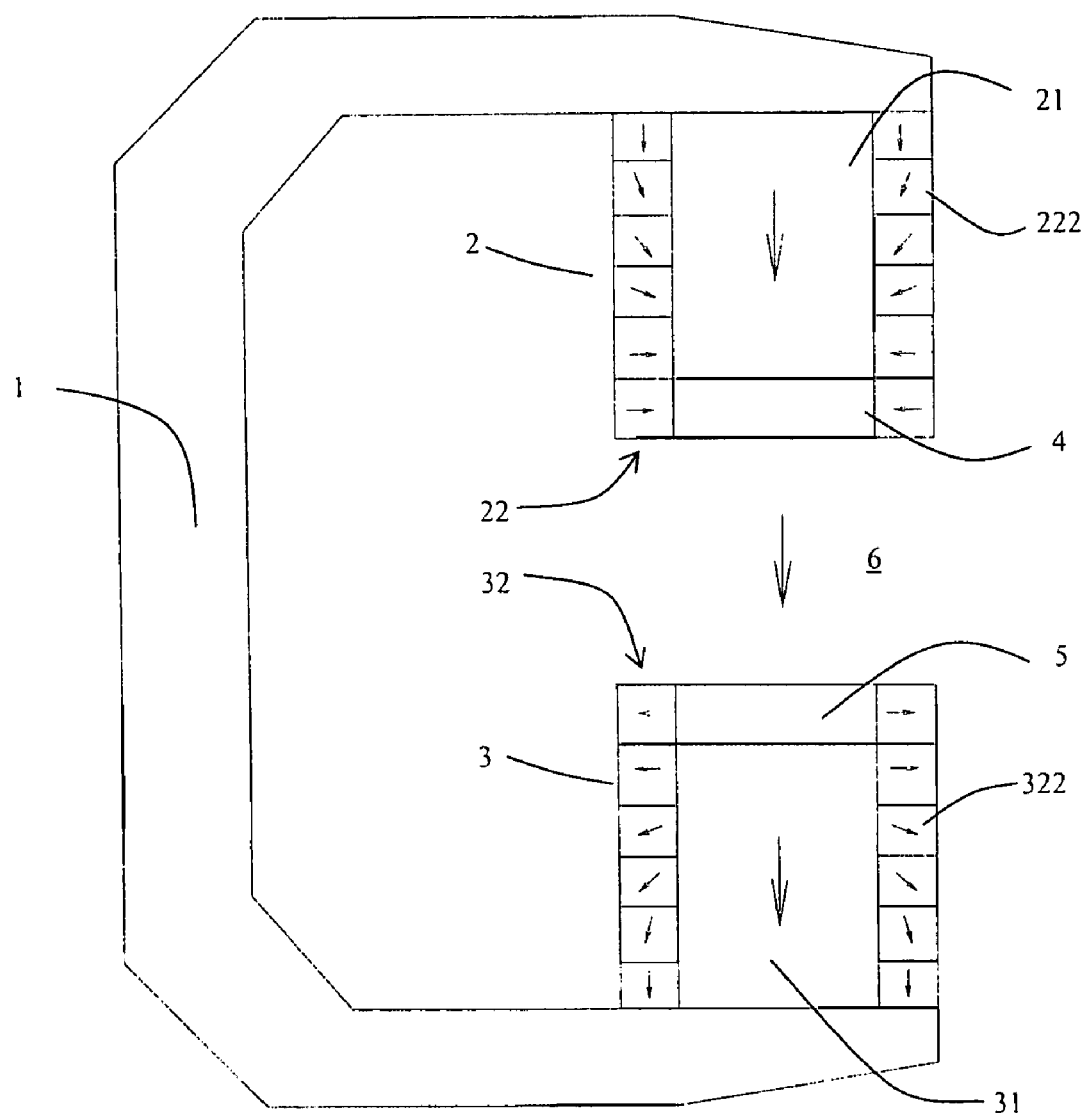
FIG. 6 shows a schematic view of the magnetic device for use in MRI according to the present invention, wherein the magnetic device uses the permanent magnet according to the present invention.

According to the second aspect of the present invention, as shown in FIG. 6, there is provided a magnetic device for use in MRI. The magnetic device comprises a magnetic yoke 1, an upper permanent magnet 2, a lower permanent magnet 3, an upper pole shoe 4, and a lower pole shoe 5.

The upper permanent magnet 2 includes a cylinder formed with a permanent magnetic material. The cylinder comprises a radial direction, a magnetic core 21 and a magnetic sheath 22, and they are coaxial. The magnetic core 21 is tightly assembled in the magnetic sheath 22. The magnetization direction of the magnetic core 21 is downward axially, and the magnetization direction of the magnetic sheath 22 changes step by step from the direction parallel to the magnetization direction of the magnetic core 21 in one end to the direction vertical to the magnetization direction of the magnetic core 21 in the other end along the axial direction of the cylinder. The magnetization direction in the upper end of the magnetic sheath 22 is downward axially, and the magnetization direction in the lower end of the magnetic sheath is inward radially.

The lower permanent magnet 3 includes a cylinder formed with a permanent magnetic material. The cylinder comprises along a radial direction, a magnetic core 31 and a magnetic sheath 32, which are coaxial. The magnetic core 31 is tightly assembled in the magnetic sheath 32. The magnetization direction of the magnetic core 31 is downward axially, and the magnetization direction of the magnetic sheath 32 changes step by step from the direction parallel to the magnetization direction of the magnetic core 31 in one end to the direction vertical to the magnetization direction of the magnetic core 31 in the other end along the axial direction of the cylinder. The magnetization direction in the upper end of the magnetic sheath 32 is outward radially, and the magnetization direction in the lower end of the magnetic sheath is downward axially.

The magnet apparatus for use in MRI shown in FIG. 6 is an embodiment of the magnet apparatus for use in MRI according to the present invention. The apparatus is an improvement that is based on the magnetic apparatus shown in FIG. 1. The improvement lies in the permanent magnet according to the present invention.

Moreover, it should be noted that, the structure of the magnet apparatus for use in MRI shown in FIG. 1 is only a kind of structure which is often used in the prior art, therefore, the present invention is not limited to the special structure shown in FIG. 6, and can adopt any other suitable structures in prior art, as said structures disclosed in the respective reference documents described in the background of the present invention.

The magnet apparatus for use in MRI according to the present invention will be described in detail with reference to the certain structure shown in FIG. 6.

In this magnet apparatus for use in MRI, the magnetic yoke 1 serves as a path for magnetic flux of the magnetic poles and a frame for the whole magnet.

The magnetic yoke 1 is known to those skilled in the art. For example, the material for the magnetic yoke 1 may be carbon steel or engineering pure iron, and its structure may be C-type or other shapes known in the prior art. It may be a unitary structure or an assembled structure. It may have some ancillary members, such as a yoke board, and so on.

Both the upper permanent magnet 2 and the lower permanent magnet 3 may be the permanent magnet according to the first aspect of the present invention.

Returning to FIG. 1 and FIGS. 2a through 2d, in a conventional magnetic device for use in MRI, because the magnetization directions of the upper permanent magnet 2 and the lower permanent magnet 3 are parallel to their axial direction, only a part of the magnetic flux generated by the upper permanent magnet 2 and the lower permanent magnet 3 pass through the air gap 6, and the other part of magnetic flux will bypass the air gap 6, thereby escaping from the circumferential surface of the magnet. Therefore, the magnetic strength in the air gap 6 of the working area is not more than 0.4 T in general.

Accordingly, in order to enhance the magnetic strength in the air gap 6 according to the present invention, the above improvement is made for the structure for use in the permanent magnet, and the improved permanent magnet is used in a magnetic device. As a result, a magnetic strength above 0.5-0.6 T in the air gap 6 can be obtained. The principle is that in the permanent magnet according to the present invention, the leakage of the magnetic flux generated by the magnetic core can be restrained effectively by the magnetization direction of the magnetic sheathes, and the magnetic strength in the working area, i.e., magnetic strength in the air gap 6, is thus enhanced effectively.

The upper pole shoe 4 and the lower pole shoe 5 may be any type of pole shoes known in the art, whose material and structure are also known to those skilled in the art. Generally speaking, the upper pole shoe includes shirt edges and shaped surfaces that face the air gap, and the lower pole shoe also includes shirt edges and shaped surfaces that face the air gap. Material for the upper pole shoe 4 and the lower pole shoe 5 may be selected from carbon steel, engineering pure iron, and combinations of these materials with silicon steel sheet or iron-based nanometer crystal.

Figure 7A:
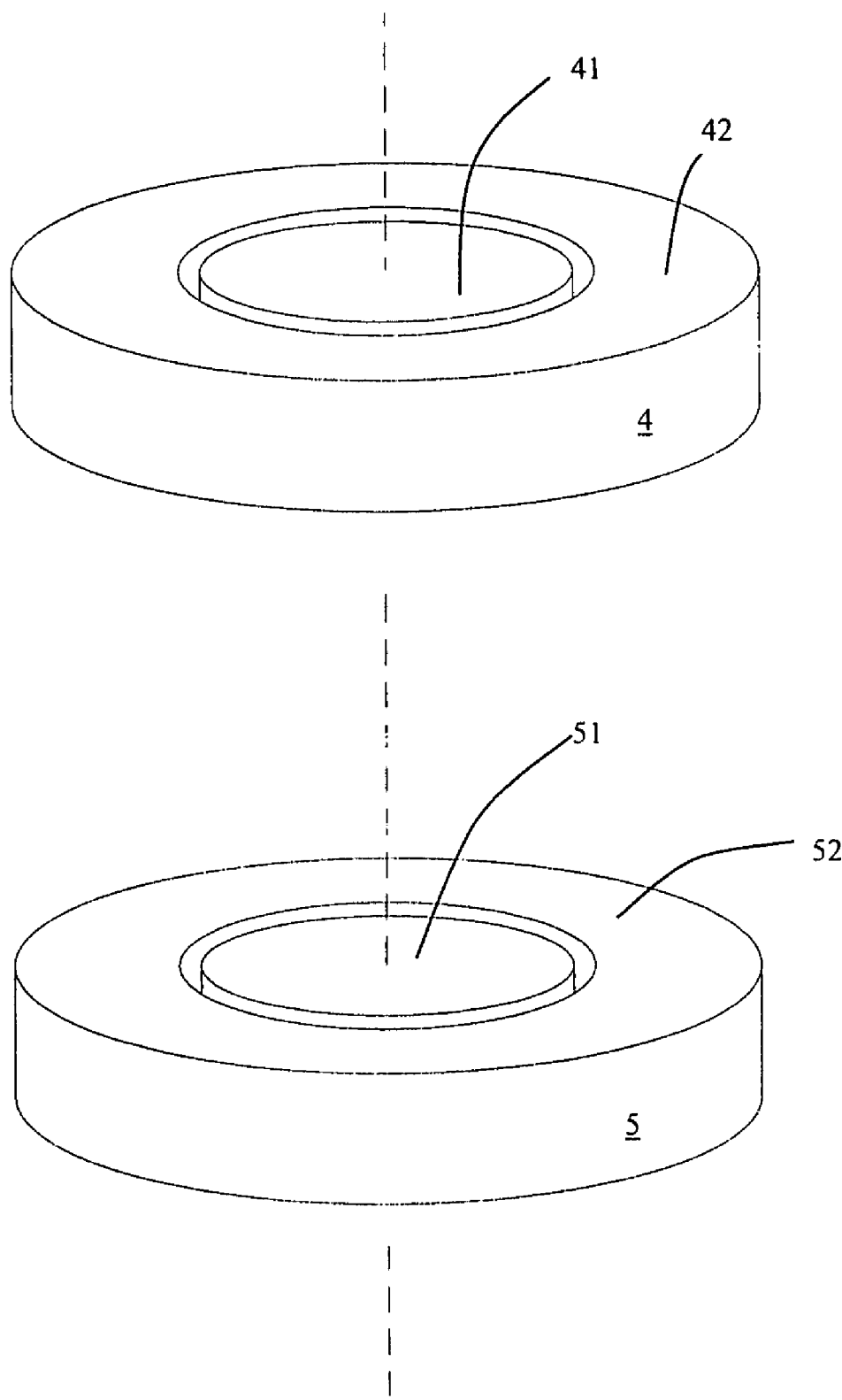
FIGS. 7a through 7b show schematic views of an embodiment of the pole shoe used in FIG. 6.
Figure 7B:
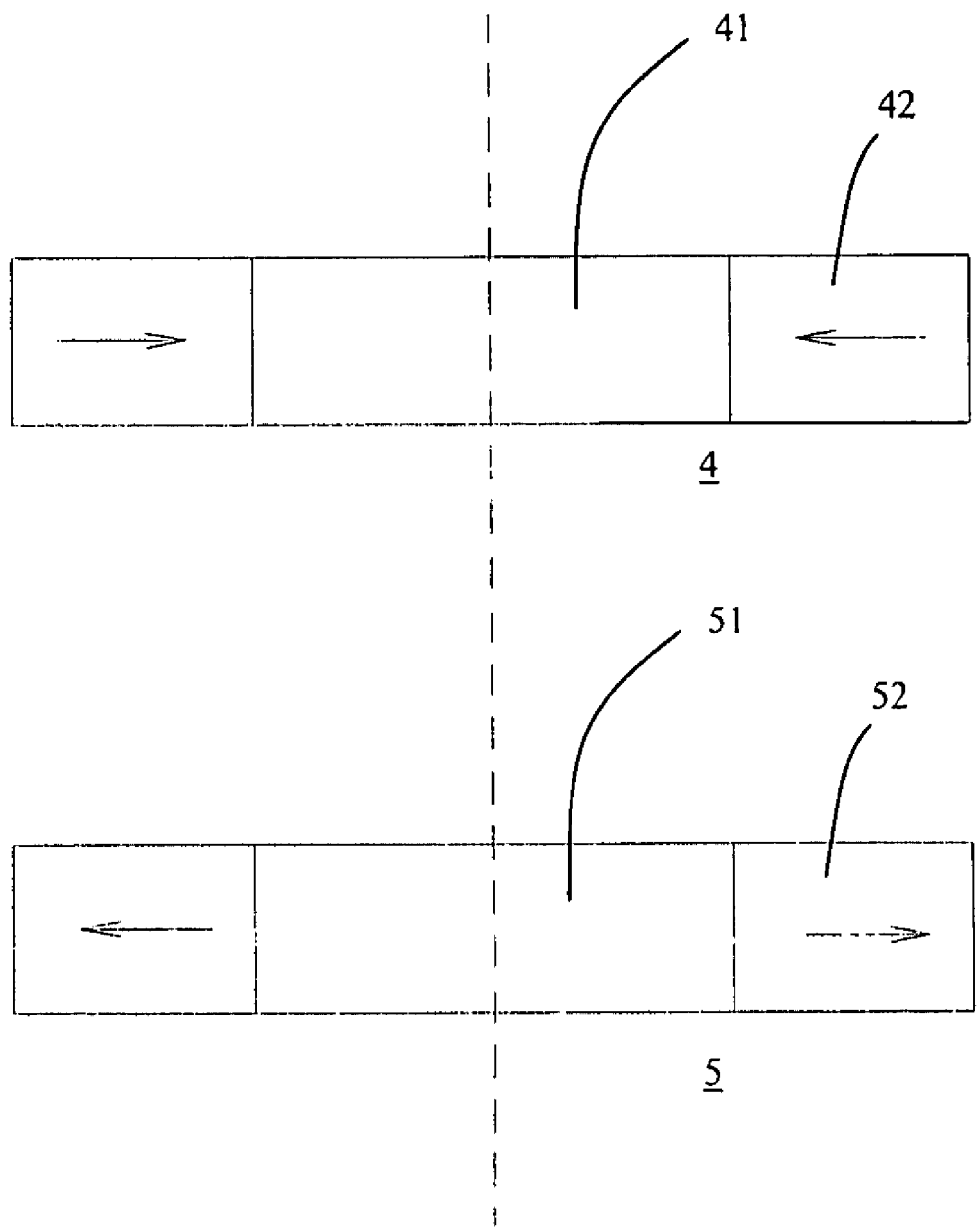

According to a preferred embodiment of the present invention, as shown in FIGS. 7a and 7b, in the magnetic device for use in MRI according to the present invention, the upper pole shoe 4 comprises a pole core 41 and a pole sheath 42 along a radial direction, which are coaxial. The pole core 41 is assembled in the pole sheath 42. The magnetization direction of the pole sheath 42 is inward radially. That is to say, the magnetization direction of the pole sheath 42 is consistent with the magnetization direction of the undermost magnetic layer 222 in the upper permanent magnet 2. The lower pole shoe 5 comprises a pole core 51 and a pole sheath 52 along a radial direction, which are coaxial. The pole core 51 is assembled in the pole sheath 52. The magnetization direction of the pole sheath 52 is outward radially. That is to say, the magnetization direction of the pole sheath 52 is consistent with the magnetization direction of the uppermost magnetic layer 322 in the lower permanent magnet 3.

Material for the pole core may be selected from carbon steel, engineering pure iron, and some combinations of these materials with silicon steel sheet or iron-based nanometer crystal. Selection range for material for the pole sheath may be the same as that for the magnetic sheath.

By using the pole shoe according to the present invention, magnetic strength in the working area, i.e., magnetic strength in the air gap 6, can be enhanced effectively, because the pole sheathes in the pole shoes can effectively restrain leakage of the magnetic flux generated by the magnetic core 21.

Figure 8:
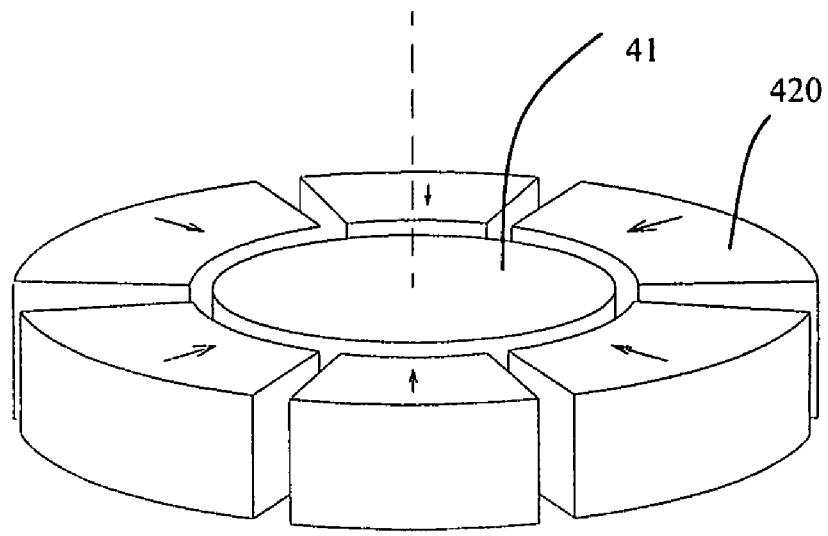
FIG. 8 shows a schematic view of another embodiment of the pole shoe used in FIG. 6.
Figure 8:
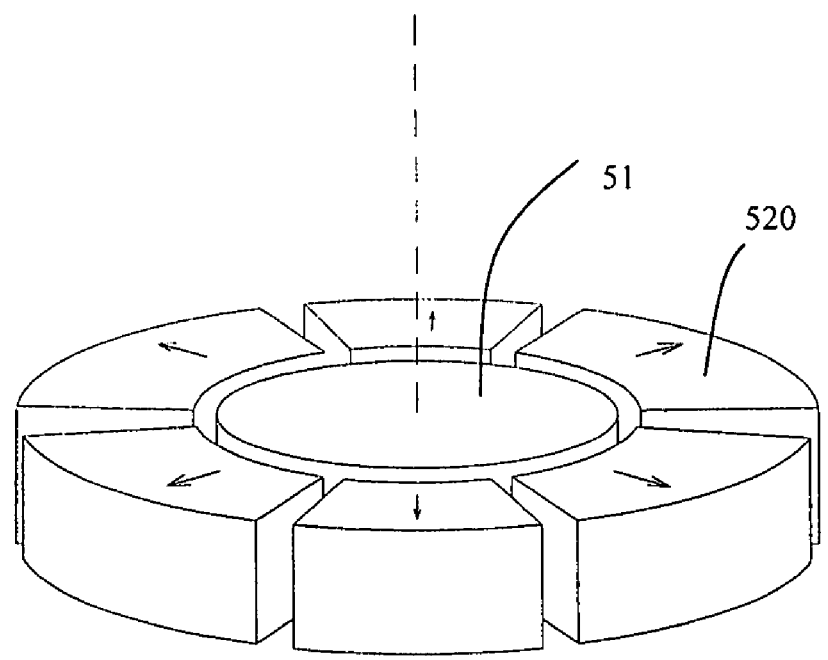

As shown in FIG. 8, preferably, the pole sheathes consist of a plurality of magnetic lobes 420 in the circumference. The size, number, material, and so on, of each magnetic lobe 420 are similar to those of the magnetic lobe 221 of the magnetic layer 22, which connects the pole sheathes in the above permanent magnet, respectively. The magnetic lobes in the upper part may correspond to those in the lower part.

The upper pole shoe 4 and the lower pole shoe 5 function as follows. The pole core can average the deviation of local magnetic performance in the permanent magnetic cylinder. Thus, the magnetic strength in the working area can be substantially averaged by the shirt-shaped edges of the pole core. The shape of the pole shoes 4, 5 is usually circular plate shape with skirt-like edges.

According to the third aspect of the present invention, there is provided a manufacturing method for a permanent magnet. The method comprises the steps of: forming a magnetic core 21 whose magnetization direction is axial; forming a magnetic sheath 22; and assembling the magnetic core 21 into the magnetic sheath 22 tightly, thus causing the magnetization direction of the magnetic sheath to change step by step from a direction which is parallel to the magnetization direction of the magnetic core in one end to a direction which is orthogonal to the magnetization direction of the magnetic core in the other end, along the axial direction of the cylinder.

The magnetic core 21 is commercially available, or can be made from a permanent magnetic material. For example, a magnetic core 21 can be manufactured by the steps of: light-cutting or line-cutting a permanent magnetic material, followed by jointing and cementing to form a desired shape.

Each magnetic lobe 222 has a certain magnetization direction, depending on its location in the magnetic sheath. There exist two usual ways for manufacturing the magnetic lobes. One way includes the following steps: designating easy magnetization directions of magnetic lobe workblanks when ordering magnetic material from a magnetic material factory, and then forming a desired magnetic lobe by cutting, line-cutting and cementing. The other way includes the following steps: ordering magnetic material workblanks with the same one specification from a magnetic material factory, and then forming desired magnetic lobes with various specifications by cutting, jointing, line-cutting, cutting by whole set, and cementing.

The magnetic core is formed by the following steps: cementing small blocks, and then inserting layer by layer each magnetic lobe into a designated place correspondingly, thus achieving the joint of the magnetic core and the magnetic sheath. During the inserting step, feeding small magnetic blocks and magnetic lobes is done by a mechanical arm with enough mechanical rigidity, manually or pneumatically.

According to the fourth aspect of the present invention, there is provided a manufacturing method for a magnetic device for use in MRI. The magnetic device comprises a magnetic yoke 1, an upper permanent magnet 2, a lower permanent magnet 3, an upper pole shoe 4, and a lower pole shoe 5.

The forming method for the upper permanent magnet 2 includes the steps of: forming a magnetic core 21 with magnetization direction being downward axially; forming a magnetic sheath 22; and assembling the magnetic core 21 into the magnetic sheath 22 tightly, thus causing the magnetization direction of the magnetic sheath to change step by step from a direction which is parallel to the magnetization direction of the magnetic core in one end to a direction which is orthogonal to the magnetization direction of the magnetic core in the other end, along the axial direction of the cylinder. The magnetization direction in the upper end of the magnetic sheath is downward axially, and the magnetization direction in the lower end is inward radially.

Moreover, the forming method for the lower permanent magnet 3 includes the steps of: forming a magnetic core 31 with magnetization direction being downward axially; forming a magnetic sheath 32; and assembling the magnetic core 31 into the magnetic sheath 32 tightly, thus causing the magnetization direction of the magnetic sheath to change step by step from a direction which is parallel to the magnetization direction of the magnetic core in one end to a direction which is orthogonal to the magnetization direction of the magnetic core in the other end, along the axial direction of the cylinder. The magnetization direction in the upper end of the magnetic sheath is outward radially, and the magnetization direction in the lower end is downward axially.

The manufacturing method for the upper permanent magnet and the lower permanent magnet may be the manufacturing method for a permanent magnet according to the third aspect of the present invention. (Description can refer to the manufacturing method for a permanent magnet.)

The upper pole shoe and the lower pole shoe may include a pole core and a pole sheath circumferentially. Manufacturing method for the pole core generally includes the steps of: feeding magnetic lobes constituting the pole sheath into a desired place by a mechanical arm, and then fixing them.

Manufacturing method for the pole sheath is generally performed by a numerically controlled machine tool.

The pole sheath may include a plurality of the magnetic lobes circumferentially. Manufacturing method for these magnetic lobes may be the same as the manufacturing method for the magnetic lobes in the above permanent magnet.

Connecting relationship between members of the magnetic device and connecting methods are known to one skilled in the art, and thus they will not be described in detail herein.

The advantages of the present invention will be further described below by an embodiment and a comparative example.

EMBODIMENT

Step 1: manufacturing a cylindrical magnetic core with magnetization direction being downward axially by use of sintered neodymium-iron-boron material. The magnetic core is 25 cm in height, and 80 cm in diameter.

Step 2: manufacturing the same magnetic lobes by 5 groups of magnetic lobes, each group including eight magnetic lobes, by use of a sintered aluminum-iron-boron material. Each magnetic lobe is 5 cm in height, and 20 cm in its radial thickness. Magnetization directions of all of the magnetic lobes are designated as follows: magnetization direction of the magnetic lobes in group 1 is downward axially; magnetization direction of the magnetic lobes in group 2 is tilted inward by 25 degrees relative to its axial direction; magnetization direction of the magnetic lobes in group 3 is tilted inward by 50 degrees relative to its axial direction; magnetization direction of the magnetic lobes in group 4 is tilted inward by 75 degrees relative to its axial direction; and magnetization direction of the magnetic lobes in group 5 is tilted inward by 90 degrees relative to its axial direction, i.e., inward radially.

Step 3: feeding eight magnetic lobes in each group into a desired place in circumference by a mechanical arm, connecting them into a ring to constitute a magnetic layer, and then assembling five magnetic layers which consist of magnetic lobes, onto the magnetic core from upper to down according to the sequence that the magnetization directions change gradually from downward axially to inward radially, thus forming a first permanent magnet.

Step 4: manufacturing a cylindrical magnetic core with magnetization direction being downward axially by use of a sintered neodymium-iron-boron material. The magnetic core is 25 cm in height, and 80 cm in diameter.

Step 5: manufacturing the same magnetic lobes by 5 groups of magnetic lobes, each group including eight magnetic lobes, by use of sintered neodymium-iron-boron material. Each magnetic lobe is 5 cm in height, and 20 cm in its radial thickness. Magnetization directions of all of the magnetic lobes are designated as follows: magnetization direction of the magnetic lobes in group 1 is downward axially; magnetization direction of the magnetic lobes in group 2 is tilted outward by 25 degrees relative to its axial direction; magnetization direction of the magnetic lobes in group 3 is tilted outward by 50 degrees relative to its axial direction; magnetization direction of the magnetic lobes in group 4 is tilted outward by 75 degrees relative to its axial direction; and magnetization direction of the magnetic lobes in group 5 is tilted outward by 90 degrees relative to its axial direction, i.e., outward radially.

Step 6: feeding eight magnetic lobes in each group into a desired place in circumference by a mechanical arm, connecting them into a ring to constitute a magnetic layer, and then assembling five magnetic layers which consist of magnetic lobes on the magnetic core from upper to down according to the sequence that magnetization directions change gradually from outward radially to downward axially, thus forming a second permanent magnet.

Step 7: manufacturing a cylindrical pole core with magnetization direction being downward axially by use of engineering pure iron. The pole core is 10 cm in height, and 80 cm in diameter.

Step 8: manufacturing eight same magnetic lobes with magnetization direction being inward radially by use of sintered neodymium-iron-boron material. The magnetic lobe is 10 cm in height and 20 cm in radial length.

Step 9: feeding eight magnetic lobes manufactured as above into a desired place by use of a mechanical arm to constitute a circumferential pole sheath, and then assembling the pole core manufactured in step 1 into the magnetic sheath, thus forming a first pole shoe.

Step 10: manufacturing a cylindrical pole core with magnetization direction being downward axially by use of engineering pure iron. The pole core is 10 cm in height, and 80 cm in diameter.

Step 11: manufacturing eight same magnetic lobes with magnetization direction being outward radially by use of sintered neodymium-iron-boron material. The magnetic lobe is 10 cm in height and 80 cm in radial length.

Step 12: feeding eight magnetic lobes manufactured as above into a desired place by use of a mechanical arm to constitute a circumferential pole sheath, and then assembling the pole core manufactured in step 1 into the magnetic sheath, thus forming a second pole shoe.

Step 13: assembling the first pole shoe and the second pole shoe on the two opposite end faces of the first permanent magnet and the second permanent magnet, respectively, and then testing magnetic strength in the air gap, thus obtaining the resultant magnetic strength of 0.5 T.

COMPARATIVE EXAMPLE

In the magnetic device for use in MRI, a conventional permanent magnet that is a single-column type (material is sintered neodymium-iron-boron, height is 25 cm, and diameter is 120 cm), conventional single-circular-plate pole shoes (material is engineering pure iron, height is 10 cm, and diameter is 120 cm) are used. The pole shoes are assembled on the opposite end faces of the upper and lower permanent magnets in the comparative example, respectively. The resultant magnetic strength is 0.37 T when the magnetic strength in the air gap is tested.

Accordingly, as shown in the above data, by using the structure according to the present invention, the highest magnetic efficiency of the permanent magnetic material can be obtained, because magnetic leakage can be restrained fully. As compared to conventional permanent magnets, magnetic strength in the working area in the present invention can be enhanced greatly even when opening extent of the magnet, total weight of magnetic material, and total weight and overall dimensions of the magnet remain substantially unchanged.

Although the invention has been described with respect to specific embodiments, the details are not to be construed as limitations, for it will become apparent that various embodiments, changes and modifications may be resorted to without departing from the spirit and scope thereof, and it is understood that such equivalent embodiments are intended to be included within the scope of this invention.

I claim:

1. A permanent magnet, comprising a cylinder formed with a permanent magnetic material, wherein the cylinder comprises a magnetic core and a magnetic sheath along a radial direction, the magnetic core and the magnetic sheath being coaxial, the magnetic core being assembled in the magnetic sheath tightly, the magnetization direction of the magnetic core being in axial direction of the cylinder, the magnetization direction of the magnetic sheath changing step by step from a direction which is parallel to the magnetization direction of the magnetic core in one end, through an inclined magnetization direction, to a direction which is orthogonal to the magnetization direction of the magnetic core in the other end, along the axial direction of the cylinder.

2. The permanent magnet as claimed in claim 1, wherein the shape of the magnetic core is one selected from the group consisting of cylindrical, hollow cylindrical, polygonal prismatic, and hollow polygonal prismatic shapes.

3. The permanent magnet as claimed in claim 1, wherein the ratio of diameter to height of the magnetic core is 1 to 5.

4. The permanent magnet as claimed in claim 1, wherein the ratio of thickness of the magnetic sheath to radius of the magnetic core is 10% to 80%.

5. The permanent magnet as claimed in claim 1, wherein the ratio of thickness to height of the magnetic sheath is 0.05 to 2.

6. The permanent magnet as claimed in claim 1, wherein the magnetic sheath includes a plurality of magnetic layers axially.

7. The permanent magnet as claimed in claim 6, wherein each the magnetic layer of the magnetic sheath includes a plurality of magnetic lobes circumferentially.

* * * * *